United States Patent
Yosui

(10) Patent No.: US 10,187,975 B2
(45) Date of Patent: Jan. 22, 2019

(54) MULTILAYER SUBSTRATE AND ELECTRONIC DEVICE

(71) Applicant: Murata Manufacturing Co., Ltd., Nagaokakyo-shi, Kyoto-fu (JP)

(72) Inventor: Kuniaki Yosui, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/726,501

(22) Filed: Oct. 6, 2017

(65) Prior Publication Data

US 2018/0042107 A1    Feb. 8, 2018

Related U.S. Application Data

(63) Continuation of application No. PCT/JP2017/012283, filed on Mar. 27, 2017.

(30) Foreign Application Priority Data

Apr. 20, 2016 (JP) .................... 2016-084371

(51) Int. Cl.
*H05K 1/02* (2006.01)
*H05K 1/18* (2006.01)
(Continued)

(52) U.S. Cl.
CPC ......... *H05K 1/0271* (2013.01); *H05K 1/0212* (2013.01); *H05K 1/0281* (2013.01);
(Continued)

(58) Field of Classification Search
CPC .. H05K 1/0271; H05K 3/4691; H05K 1/0281; H05K 1/183; H05K 1/0212; H05K 3/4635
See application file for complete search history.

(56) References Cited

U.S. PATENT DOCUMENTS

2012/0153448 A1* 6/2012 Ihara .................... H01L 23/552
                                                                  257/675
2012/0181068 A1   7/2012 Kato et al.
(Continued)

FOREIGN PATENT DOCUMENTS

JP   2016-504751 A   2/2016
WO  2011/040393 A1  4/2011
(Continued)

OTHER PUBLICATIONS

Official Communication issued in International Patent Application No. PCT/JP2017/012283, dated May 9, 2017.

*Primary Examiner* — Hoa C Nguyen
(74) *Attorney, Agent, or Firm* — Keating & Bennett, LLP

(57) ABSTRACT

A multilayer substrate includes a substrate body defined by a laminate of flexible insulating base materials, a short component, and tall components. The substrate body includes a first region and a second region. The first region is surrounded by the second region in plan view, and is shorter than the second region. The short component is mounted on a bottom surface of a recess defined by the first region and the second region. The tall components are embedded in the second region of the substrate body and are disposed at positions including the position of a mounting surface for the short component in the height direction of the substrate body and on both sides of the first region when the substrate body is viewed in plan.

19 Claims, 8 Drawing Sheets

(51) Int. Cl.
*H05K 3/46* (2006.01)
*H05K 3/28* (2006.01)

(52) U.S. Cl.
CPC ............ *H05K 1/183* (2013.01); *H05K 1/186* (2013.01); *H05K 1/189* (2013.01); *H05K 3/4623* (2013.01); *H05K 3/4635* (2013.01); *H05K 3/4691* (2013.01); *H05K 3/4697* (2013.01); *H05K 3/281* (2013.01); *H05K 2201/0141* (2013.01)

(56) References Cited

U.S. PATENT DOCUMENTS

| | | |
|---|---|---|
| 2014/0110859 A1 | 4/2014 | Rafferty et al. |
| 2014/0247570 A1 | 9/2014 | Wang et al. |
| 2014/0252522 A1* | 9/2014 | Miyazaki .......... H01L 27/14605 257/432 |
| 2016/0330844 A1 | 11/2016 | Otsubo |

FOREIGN PATENT DOCUMENTS

| | | |
|---|---|---|
| WO | 2012/132524 A1 | 10/2012 |
| WO | 2015/156141 A1 | 10/2015 |

* cited by examiner

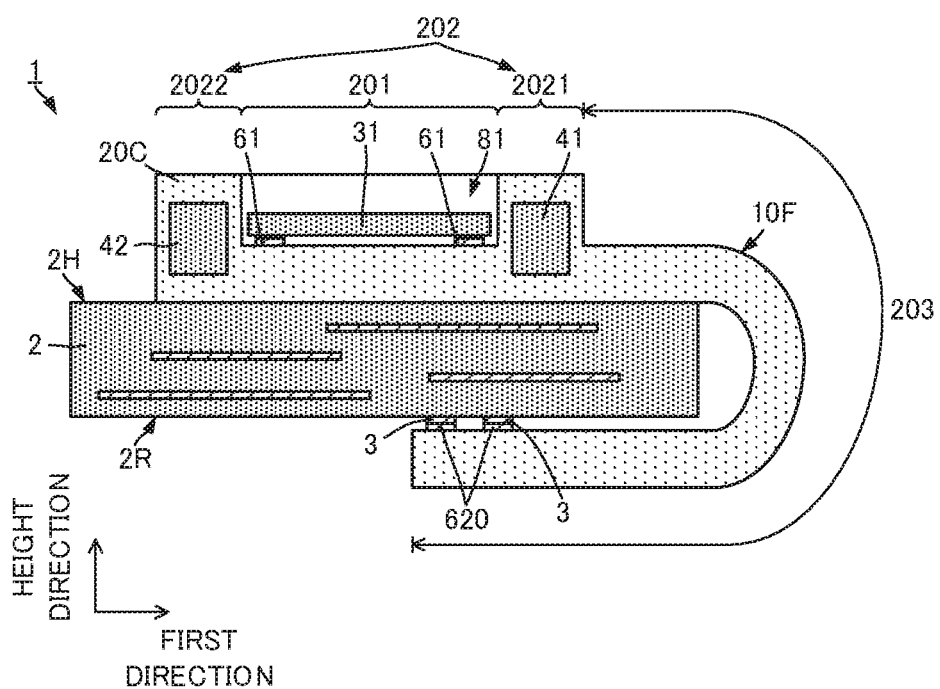

MULTILAYER SUBSTRATE AND ELECTRONIC DEVICE

CROSS REFERENCE TO RELATED APPLICATIONS

This application claims the benefit of priority to Japanese Patent Application No. 2016-084371 filed on Apr. 20, 2016 and is a Continuation Application of PCT Application No. PCT/JP2017/012283 filed on Mar. 27, 2017. The entire contents of each application are hereby incorporated herein by reference.

BACKGROUND OF THE INVENTION

1. Field of the Invention

The present invention relates to a multilayer substrate including a substrate body defined by a laminate of a plurality of flexible base materials and a component mounted on the substrate body, and to an electronic device including the multilayer substrate.

2. Description of the Related Art

There have been devised various types of multilayer substrates each defined by a laminate of a plurality of flexible base materials. As such a multilayer substrate, International Publication No. 2011/040393 describes a circuit board including a substrate body defined by a laminate of a plurality of flexible base materials.

In the circuit board of International Publication No. 2011/040393, the substrate body includes relatively hard rigid regions and a relatively soft flexible region. Inside the rigid regions of the circuit board, large-area conductor patterns are provided. Thus, the rigid regions are relatively harder than the flexible region. Components are mounted on the rigid regions.

In the above-described structure, however, the rigid regions sometimes deform, similarly to the flexible region. By deformation of the rigid regions, stress is applied to the components, and the components sometimes come off the circuit board. Also, when the stress is applied to the components, the components are sometimes damaged. Particularly, a component having a large planar shape is subject to stress, and more easily comes off the circuit board. The component having the large planar shape is also more easily damaged.

SUMMARY OF THE INVENTION

Preferred embodiments of the present invention provide multilayer substrates that prevent a component from being damaged and coming off due to stress such as bending stress.

A multilayer substrate according to a preferred embodiment of the present invention includes a substrate body defined by a laminate of a plurality of flexible insulating base materials, a short component mounted on the substrate body, and a first tall component and a second tall component mounted on the substrate body. The substrate body includes a first region and a second region. The first region is surrounded by the second region in plan view, and is shorter than the second region. The short component is mounted on a bottom surface of a recess defined by the first region and the second region. The first tall component and the second tall component are embedded in the second region of the substrate body, and are disposed at positions including a position of a mounting surface for the short component in a height direction of the substrate body and located on both sides of the first region when the substrate body is viewed in plan.

In this structure, the first tall component and the second tall component suppress stress due to, for example, bending of the substrate body from being applied to the mounting surface for the short component.

Preferably, the multilayer substrate further includes a third tall component embedded in the second region.

In this structure, since the third tall component is provided, the stress is less likely to be applied to the mounting surface for the short component.

Preferably, the second region includes four side wall surfaces of the recess, and the side wall surfaces define a first portion, a second portion, a third portion, and a fourth portion. The first region is provided between the first portion and the second portion and between the third portion and the fourth portion. The first tall component is disposed in the first portion, and the second tall component is disposed in the second portion.

In this structure, the recess preferably is rectangular or substantially rectangular in plan view. According to this structure, the first tall component and the second tall component are disposed so that the first region is located therebetween.

Preferably, the third tall component is disposed in at least one of the first portion and the second portion.

In this structure, rigidity of at least one of the first portion and the second portion is increased.

Preferably, the third tall component is disposed in at least one of the third portion and the fourth portion.

In this structure, the tall components are disposed on at least three sides around the first region where the short component is mounted, when the substrate body is viewed in plan. Therefore, the stress is less likely to be applied to the mounting surface for the short component.

A thickness of the short component may be smaller than a thickness of a thinnest flexible insulating base material of the plurality of flexible insulating base materials.

Even when the short component is thin in this way, the above-described structure effectively suppresses breakage and coming-off of the short component.

The substrate body may include a third region shorter than the second region, and the third region may be disposed on a side of the second region opposite from the first region.

In this structure, a portion having high flexibility is provided in the substrate body.

Preferably, the multilayer substrate further includes an elastic member having a Young's modulus lower than a Young's modulus of the substrate body, and the elastic member covers a boundary portion between the second region and the third region.

In this structure, breakage is prevented at the boundary portion between the second region and the third region.

Preferably, the multilayer substrate further includes a protective member on a surface of the elastic member opposite from the substrate body.

In this structure, breakage is further prevented at the boundary portion between the second region and the third region.

The third region may be bent.

In this structure, the degree of flexibility in arranging the multilayer substrate is increased.

An electronic device according to another preferred embodiment of the present invention includes any of the above-described multilayer substrates, and a circuit board.

An external connection conductor is provided in the third region, and is electrically coupled to the circuit board.

In this structure, the degree of freedom of the structure that mounts and bonds the multilayer substrate on the circuit board is increased.

The first region and the second region may be disposed on one principal surface of the circuit board, and the external connection conductor may be electrically coupled to the circuit board on the other principal surface of the circuit board.

In this structure, the multilayer substrate is easily wound around the circuit board.

According to various preferred embodiments of the present invention, the component is prevented from coming off the substrate and from being damaged.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 8 is a cross-sectional view illustrating a structure of an electronic device including a multilayer substrate according to a seventh preferred embodiment of the present invention.

DETAILED DESCRIPTION OF THE PREFERRED EMBODIMENTS

Figure 1A:
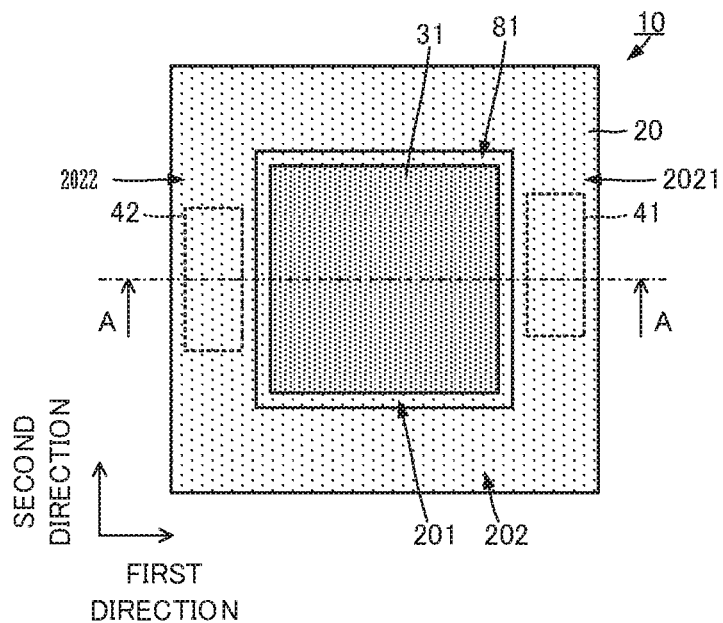
FIGS. 1A and 1B are a plan view and a cross-sectional view, respectively, of a multilayer substrate according to a first preferred embodiment of the present invention.
Figure 1B:
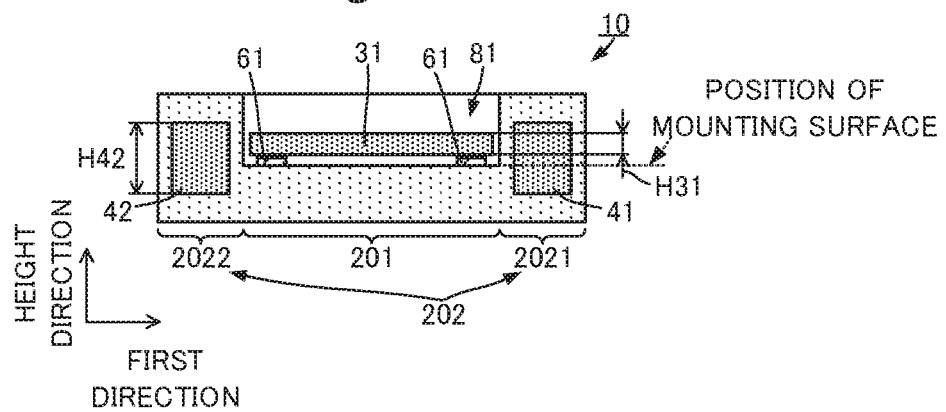

Multilayer substrates according to preferred embodiments of the present invention will be described with reference to the drawings. FIG. 1A is a plan view of a multilayer substrate 10 according to a first preferred embodiment of the present invention, and FIG. 1B is a cross-sectional view of the multilayer substrate according to the first preferred embodiment. FIG. 1B is a cross-sectional view taken along line A-A in FIG. 1A.

The multilayer substrate 10 includes a substrate body 20, a short component 31, and a plurality of tall components 41 and 42. The tall component 41 corresponds to a "first tall component", and the tall component 42 corresponds to a "second tall component".

The substrate body 20 preferably is rectangular or substantially rectangular in plan view, for example. The substrate body 20 is a multilayer body defined by a laminate of a plurality of flexible insulating base materials 21, 22, 23, and 24 (see FIG. 2). The substrate body 20 includes a first region 201 and a second region 202 in plan view. When the substrate body 20 is viewed in plan, the second region 202 surrounds the first region 201. The second region 202 includes a first portion 2021 and a second portion 2022 on both sides of the first region 201 in a first direction. Although not illustrated, a conductor pattern of an electric circuit to be realized by the multilayer substrate 10 is provided in the substrate body 20.

The first region 201 is shorter than the second region 202. That is, the thickness (dimension in the height direction) of the first region 201 is smaller than the thickness of the second region 202. One end surface of the first region 201 in the height direction is flush with one end surface of the second region 202 in the height direction. Thus, the substrate body 20 is partly recessed in the height direction to form a recess 81. When the substrate body 20 is viewed in plan, a portion that defines a bottom surface of the recess 81 is the first region 201, and a portion that defines a wall surrounding the recess 81 is the second region 202.

For example, the short component 31 preferably includes various types of IC chips. The plurality of tall components 41 and 42 are mounted elements such as a capacitor, an inductor, and a resistor. The tall components 41 and 42 do not always need to have an electric function.

The short component 31 is shorter than the tall components 41 and 42. Specifically, as illustrated in FIG. 1B, a thickness H31 of the short component 31 is smaller than a thickness H42 of the tall component 42. The thickness of the tall component 41 is equal to the thickness H42 of the tall component 42. The thicknesses of the tall components 41 and 42 do not always need to be equal, and it is only required that the thicknesses of the tall components 41 and 42 should be larger than the thickness of the short component 31.

The short component 31 is mounted in the first region 201, that is, on the bottom surface of the recess 81. Specifically, mounting land conductors 61 are provided on the bottom surface of the recess 81. The short component 31 is mounted on the mounting land conductors 61 with, for example, solder. For example, an anisotropic conductive film can be used instead of solder. The short component 31 may be bonded to the mounting land conductors 61 by ultrasonic bonding. In this way, the bottom surface of the recess 81 defines and functions as a mounting surface for the short component 31. The thickness H31 of the short component 31 is smaller than the height (depth) of the recess 81. Therefore, the short component 31 fits in the recess 81.

The tall component 41 is embedded in the first portion 2021 of the second region 202. The tall component 41 is disposed to include the position of the mounting surface for the short component 31 in the height direction. In other words, the tall component 41 is disposed to cross the position of the mounting surface for the short component 31 in the height direction.

The tall component 42 is embedded in the second portion 2022 of the second region 202. The tall component 42 is disposed to include the position of the mounting surface for the short component 31 in the height direction. In other words, the tall component 42 is disposed to cross the position of the mounting surface for the short component 31 in the height direction.

The tall component 41 and 42 have a rigidity higher than the rigidity of insulating base materials that form the plurality of flexible insulating base materials 21, 22, 23, and 24.

According to the structure of the multilayer substrate 10, since the first region 201 is surrounded by the second region 202 that is thicker than the first region 201, stress is rarely applied from the outside to the first region 201 by, for example, bending. Therefore, stress is rarely applied to the first region 201 and the short component 31. This prevents the short component 31 from being damaged and coming off the mounting land conductors 61.

In the structure of the multilayer substrate 10, the plurality of tall components 41 and 42 are embedded in the second region 202, and this increases the rigidity of the second region 202. Thus, stress is less likely to be applied to the first region 201 and the short component 31. This further prevents the short component 31 from being damaged and coming off the mounting land conductors 61.

In the structure of the multilayer substrate 10, the first region 201 is located between the tall components 41 and 42. This structure uniformly or substantially uniformly increases rigidity on both sides of the first region 201 in the first direction. Therefore, stress is less likely to be applied to the first region 201 and the short component 31. This further prevents the short component 31 from being damaged and coming off the mounting land conductors 61.

When the substrate body is produced by stacking a plurality of flexible insulating base materials, the flexible insulating base materials flow and deform. In this case, stress is applied to the components embedded in the substrate body. In the multilayer substrate 10 of the first preferred embodiment, however, the short component 31 is not embedded in the substrate body 20, and therefore, the short component 31 is prevented from being damaged by such stress during production.

Since the tall components 41 and 42 are less likely to be broken than the short component 31, they are rarely damaged even when embedded in the multilayer substrate 10. Further, since the tall components 41 and 42 are embedded in the multilayer substrate 10, for example, without increasing the thickness of the second region 202 more than necessary, these components are prevented from coming off the surface of the multilayer substrate 10 when the stress is applied thereto, compared with the case in which the tall components 41 and 42 are mounted on the surface of the multilayer substrate 10.

Figure 2:
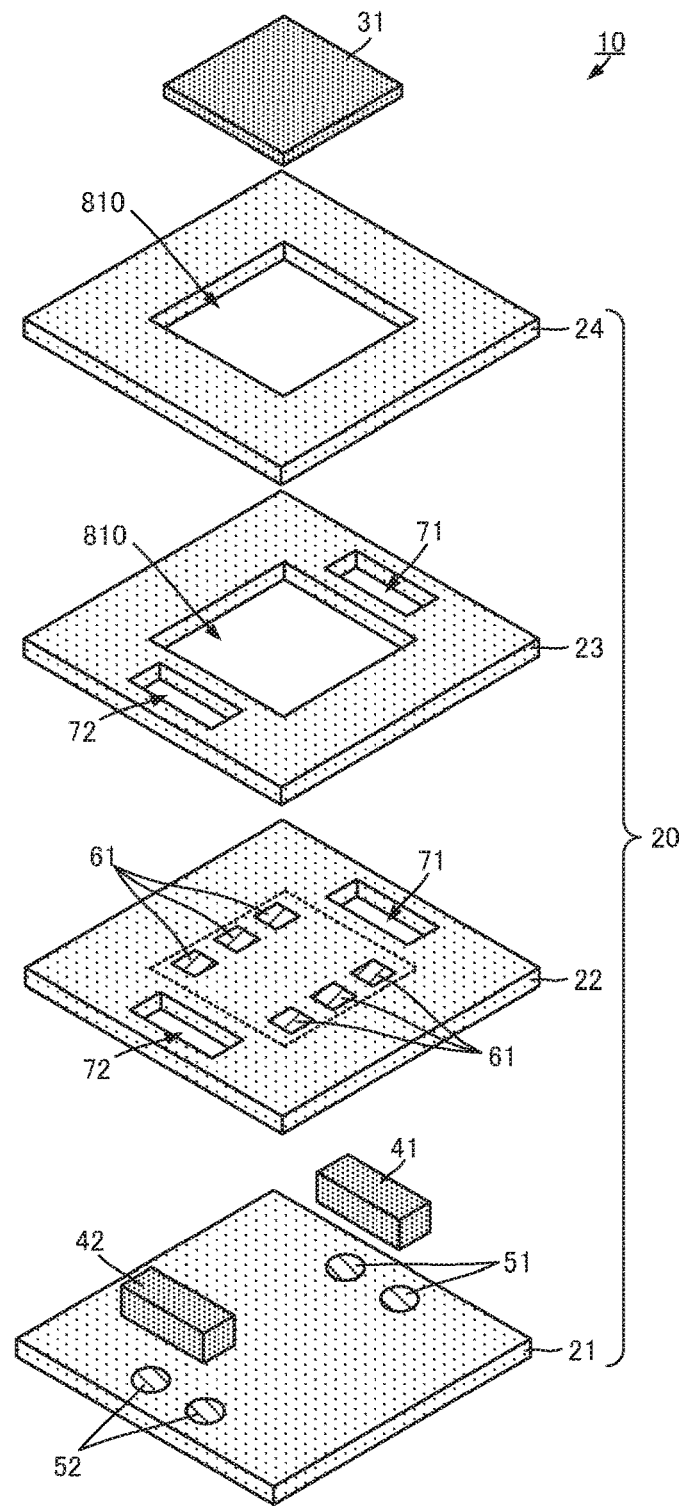
FIG. 2 is an exploded perspective view of the multilayer substrate according to the first preferred embodiment of the present invention.

More specifically, the multilayer substrate 10 is as illustrated in FIG. 2. FIG. 2 is an exploded perspective view of the multilayer substrate 10 according to the first preferred embodiment of the present invention.

As illustrated in FIG. 2, the substrate body 20 includes a plurality of flexible insulating base materials 21, 22, 23, and 24. The flexible insulating base materials 21, 22, 23, and 24 are stacked and mainly composed of, for example, a liquid crystal polymer. The thickness of the flexible insulating base materials 21, 22, 23, and 24 is smaller than the thickness of the tall components 41 and 42. Specifically, the thickness of the tall components 41 and 42 is equal or substantially equal to the sum of the thickness of the flexible insulating base material 22 and the thickness of the flexible insulating base material 23.

Interlayer connection conductors 51 and 52 are exposed on a surface of the flexible insulating base material 21 facing the flexible insulating base material 22. The tall component 41 are bonded to a plurality of interlayer connection conductors 51, and the tall component 42 is bonded to a plurality of interlayer connection conductors 52.

A plurality of mounting land conductors 61 are provided on a surface of the flexible insulating base material 22 facing the flexible insulating base material 23. Specifically, the mounting land conductors 61 are provided in the first region 201 of the substrate body 20. The flexible insulating base material 22 includes a plurality of through holes 71 and 72. The through hole 71 has such a shape that the tall component 41 extends therethrough. The through hole 72 has such a shape that the tall component 42 extends therethrough.

The region where the mounting land conductors 61 are provided is located between the through holes 71 and 72. Specifically, the through hole 71 is provided in the first portion 2021 of the second region 202 in the substrate body 20. The through hole 72 is provided in the second portion 2022 of the second region 202 in the substrate body 20.

The flexible insulating base material 23 includes a plurality of through holes 71, 72, and 810. The through hole 71 has such a shape that the tall component 41 extends therethrough, and the through hole 72 has such a shape that the tall component 42 extends therethrough. The through hole 810 is shaped to receive the short component 31. The through hole 810 has such a shape that the mounting land conductors 61 are included therein when the substrate body 20 is viewed in plan.

The plurality of through holes 71 and 72 are arranged so that the through hole 810 is located therebetween. The through hole 71 is provided in the first portion 2021 of the second region 202 in the substrate body 20. In a state in which the flexible insulating base material 22 and the flexible insulating base material 23 are stacked, the through hole 71 of the flexible insulating base material 23 communicates with the through hole 71 of the flexible insulating base material 22. The through hole 72 is provided in the second portion 2022 of the second region 202 in the substrate body 20. In a state in which the flexible insulating base material 22 and the flexible insulating base material 23 are stacked, the through hole 72 of the flexible insulating base material 23 communicates with the through hole 72 of the flexible insulating base material 22.

The flexible insulating base material 24 has a through hole 810. The through hole 810 is shaped to receive the short component 31. The through hole 810 has such a shape that the plurality of mounting land conductors 61 are included therein when the substrate body 20 is viewed in plan. In a state in which the flexible insulating base material 23 and the flexible insulating base material 24 are stacked, the through hole 810 of the flexible insulating base material 24 communicates with the through hole 810 of the flexible insulating base material 23.

The short component 31 is mounted on the plurality of mounting land conductors 61. The thickness (dimension in the height direction) of the short component 31 is smaller than the thickness of each of the flexible insulating base materials 21, 22, 23, and 24.

According to this structure, the tall component 41 is embedded in the first portion 2021 of the second region 202 in the substrate body 20. The tall component 42 is embedded in the second portion 2022 of the second region 202 in the substrate body 20. According to this structure, the tall components 41 and 42 are disposed to include (cross) the mounting surface for the short component 31 in the height direction of the substrate body 20.

When the thickness H31 of the short component 31 is smaller than the thicknesses of the flexible insulating base materials 21, 22, 23, and 24, the low component 31 is subject to the above-described stress. Therefore, the structure of the present preferred embodiment is more effective when the thickness H31 of the short component 31 is smaller than the thicknesses of the flexible insulating base materials 21, 22, 23, and 24. The structure of the present preferred embodiment is more effective particularly when the thicknesses of the flexible insulating base materials 21, 22, 23, and 24 are different and the thickness of the short component 31 is smaller than the thickness of the thinnest flexible insulating base material.

The multilayer substrate 10 having this structure is produced by the following example production method. First, a plurality of flexible insulating base materials 21, 22, 23, and 24 are prepared. A conductor is attached to one surface of each of the flexible insulating base materials 21, 22, 23, and 24. The attached conductor is made of, for example, copper. A conductor pattern is formed on the flexible insulating base materials 21, 22, 23, and 24 each having the conductor on one surface by a technique such as pattern etching. At this time, a plurality of mounting land conductors 61 are formed on the flexible insulating base material 22 as a part of the conductor pattern. Also, a conductor pattern for interlayer connection conductors 51 and 52 is formed on the flexible insulating base material 21.

In the flexible insulating base material 21, through holes for interlayer connection conductors 51 and 52 are formed by using the conductor pattern for the interlayer connection conductors 51 and 52 as lids (bottom surfaces), and the through holes are filled with conductive paste. A plurality of through holes 71 and 72 are formed in the flexible insulating base material 22. A plurality of through holes 71, 72, and 810 are formed in the flexible insulating base material 23, for example, by punching or laser machining. A through hole 810 is formed in the flexible insulating base material 24.

A tall component 41 is superposed on the through holes filled with the conductive paste for the interlayer connection conductors 51, and a tall component 42 is superposed on the through holes filled with the conductive paste for the interlayer connection conductors 52.

In this state, the plurality of flexible insulating base materials 21, 22, 23, 24 are stacked and hot-pressed. Thus, a substrate body 20 including a recess 81 is formed. Without forming the through holes 810 in the flexible insulating base materials 23 and 24, the recess 81 may be dug from the side of the flexible insulating base material 24, for example, by a laser after the flexible insulating base materials 21, 22, 23, and 24 are stacked and hot-pressed.

A short component 31 is put into the recess 81, and is mounted on the plurality of mounting land conductors 61 with, for example, solder.

The length in which the tall components 41 and 42 are opposed to wall surfaces of the recess 81 close to the tall components 41 and 42 (length in the second direction in FIG. 1A) is preferably more than or equal to about ⅓ of the length of the wall surfaces, and more preferably more than or equal to about ½, for example. This further increases the rigidity of the second region 202, more effectively reduces damage of the short component 31, and more effectively prevents the short component 31 from coming off the mounting land conductors 61.

Figure 3:
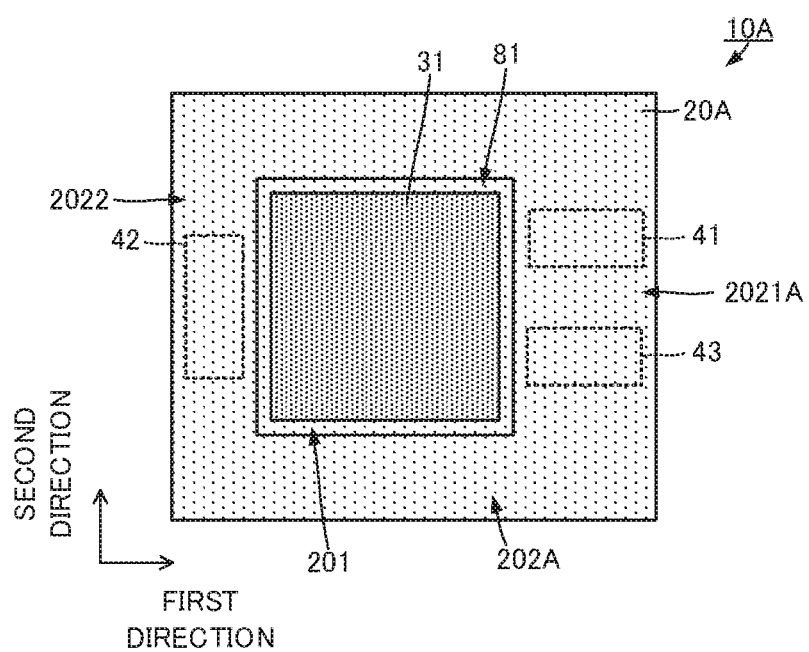
FIG. 3 is a plan view illustrating a structure of a multilayer substrate according to a second preferred embodiment of the present invention.

Next, a multilayer substrate according to a second preferred embodiment of the present invention will be described with reference to the drawing. FIG. 3 is a plan view illustrating a structure of the multilayer substrate according to the second preferred embodiment of the present invention.

A multilayer substrate 10A according to the second preferred embodiment is different from the multilayer substrate 10 of the first preferred embodiment in further including a tall component 43. Structures of the multilayer substrate 10A other than a structure relating to the tall component 43 are the same as those of the multilayer substrate 10 of the first preferred embodiment, and descriptions of the same structures are skipped. The tall component 43 corresponds to a "third tall component".

The multilayer substrate 10A includes a substrate body 20A. The substrate body 20A includes a first region 201 and a second region 202A. The second region 202A includes a first portion 2021A and a second portion 2022 between which the first region 201 is located, when the substrate body 20A is viewed in plan.

The tall component 43 is similar to a plurality of tall components 41 and 42. The thickness of the tall component 43 is equal or substantially equal to the thicknesses of the tall components 41 and 42, and is larger than the thickness of a short component 31.

The tall component 41 and the tall component 43 are disposed in the first portion 2021A of the second region 202A. Similarly to the tall component 41, the tall component 43 is embedded in the substrate body 20A, and is disposed to include (cross) a mounting surface for the short component 31 in the height direction of the substrate body 20A.

The tall component 41 and the tall component 43 are arranged parallel or substantially parallel to a wall surface of the recess 81 closest thereto.

Even this structure more effectively prevents the short component 31 from being damaged and coming off mounting land conductors 61, similarly to the multilayer substrate 10 of the first preferred embodiment. Further, in the structure of the second preferred embodiment, the number of tall components embedded in the first portion 2021A of the second region 202A increases, and this further increases the rigidity of the first portion 2021A.

Figure 4:
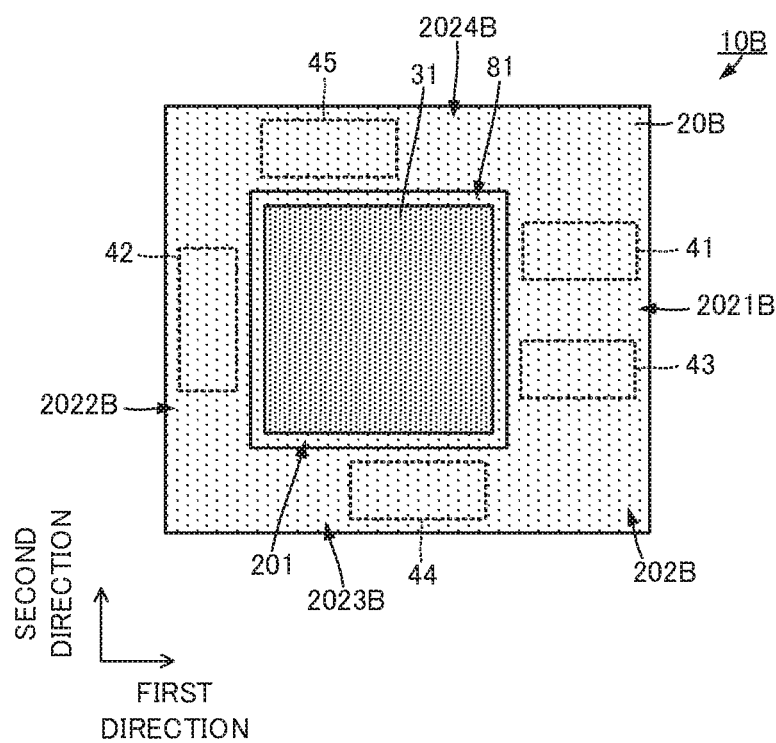
FIG. 4 is a plan view illustrating a structure of a multilayer substrate according to a third preferred embodiment of the present invention.

Next, a multilayer substrate according to a third preferred embodiment of the present invention will be described with reference to the drawing. FIG. 4 is a plan view illustrating a structure of the multilayer substrate according to the third preferred embodiment of the present invention.

As illustrated in FIG. 4, a multilayer substrate 10B according to the third preferred embodiment is different from the multilayer substrate 10A of the second preferred embodiment in further including a plurality of tall components 44 and 45. Structures of the multilayer substrate 10B other than structures relating to the tall components 44 and 45 are the same as those of the multilayer substrate 10A of the second preferred embodiment, and descriptions of the same structures are skipped. Each of the tall components 44 and 45 corresponds to a "third tall component".

The multilayer substrate 10B includes a substrate body 20B. The substrate body 20B includes a first region 201 and a second region 202B. The second region 202B includes a first portion 2021B and a second portion 2022B on both sides of the first region 201 in the first direction, when the substrate body 20B is viewed in plan. The second region 202B further includes a third portion 2023B and a fourth portion 2024B on both sides of the first region 201 in the second direction, when the substrate body 20B is viewed in plan. That is, the first region 201 is surrounded by the first portion 2021B, the second portion 2022B, the third portion 2023B, and the fourth portion 2024B that define four wall surfaces of a recess 81, when the substrate body 20B is viewed in plan.

The tall components 44 and 45 are similar to a plurality of tall components 41, 42, and 43. The thickness of the tall components 44 and 45 is equal or substantially equal to the thickness of the tall components 41, 42, and 43, and is larger than the thickness of a short component 31.

The tall components 41, 42, 43, 44, and 45 are embedded in the substrate body 20B, and are disposed to include (cross) a mounting surface for the short component 31 in the height direction of the substrate body 20B.

The tall components 41 and 43 are disposed in the first portion 2021B of the second region 202B. The tall component 42 is disposed in the second portion 2022B of the second region 202B. The tall component 44 is disposed in the third portion 2023B of the second region 202B. The tall component 45 is disposed in the fourth portion 2024B of the second region 202B.

Even this structure more effectively prevents the short component 31 from being damaged and coming off mounting land conductors 61, similarly to the multilayer substrates 10 and 10A of the first and second preferred embodiments.

Further, in the structure of the third preferred embodiment, the tall components are embedded on all four sides of the second region 202B surrounding the first region 201 when the substrate body 20B is viewed in plan. This further increases the rigidity of the second region 202B.

It is possible to adopt a structure in which the tall component 44 is provided in the third portion 2023B, but the tall component 45 is not provided in the fourth portion 2024B. It is also possible to adopt a structure in which the tall component 44 is not provided in the third portion 2023B, but the tall component 45 is provided in the fourth portion 2024B.

Figure 5:
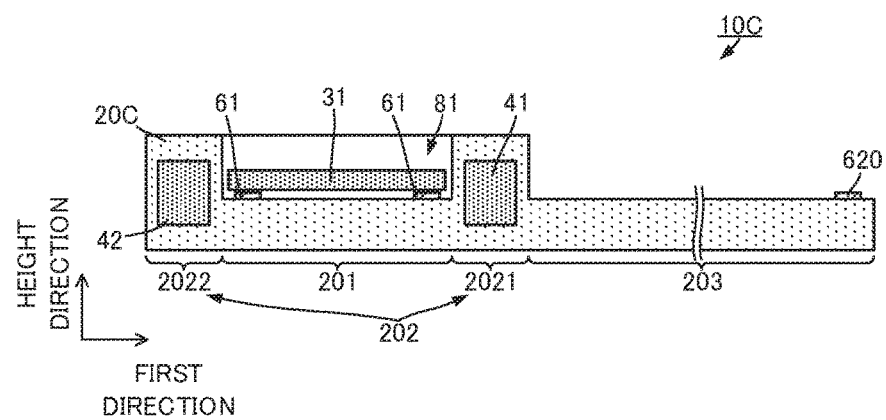
FIG. 5 is a cross-sectional view illustrating a structure of a multilayer substrate according to a fourth preferred embodiment of the present invention.

Next, a multilayer substrate according to a fourth preferred embodiment of the present invention will be described with reference to the drawing. FIG. 5 is a cross-sectional view illustrating a structure of the multilayer substrate according to the fourth preferred embodiment of the present invention.

As illustrated in FIG. 5, a multilayer substrate 10C according to the fourth preferred embodiment is different from the multilayer substrate 10 of the first preferred embodiment in that a substrate body 20C includes a third region 203. Other structures of the multilayer substrate 10C are the same as those of the multilayer substrate 10 of the first preferred embodiment, and descriptions of the same structures are skipped.

The substrate body 20C includes a third region 203. The third region 203 is connected to a first portion 2021 of a second region 202. The third region 203 is connected to a side of the first portion 2021 of the second region 202 opposite from a first region 201. The third region 203 is provided integrally with the first region 201 and the second region 202.

The thickness of the third region 203 is smaller than the thickness of the second region 202. In the example of FIG. 5, the thickness of the first region 201 and the thickness of the third region 203 are equal or approximately equal to each other. In the example of FIG. 5, a plurality of flexible insulating base materials of the first region 201 are the same as a plurality of flexible insulating base materials of the third region 203. The thickness of the third region 203 may be different from the thickness of the first region 201.

An external connection conductor 620 is provided in an end portion of the third region 203 opposite from an end portion connected to the first portion 2021. The external connection conductor 620 is connected to a conductor pattern in the second region 202 by a conductor pattern in the third region 203. These conductor patterns are not illustrated in FIG. 5. As the external connection conductor, for example, a connector component may be disposed.

In this structure, a short component 31 is prevented from being damaged and coming off mounting land conductors 61 while ensuring flexibility of the third region 203. Since the external connection conductor 620 is disposed in the end portion of the third region 203 opposite from the end portion connected to the first portion 2021, when the multilayer substrate 10C is mounted on an external circuit board, the external connection conductor 620 is able to be easily routed. As a result, stress applied to the first region 201 and the second region 202 is significantly reduced or prevented.

While the third region 203 is connected to the first portion 2021 in the multilayer substrate 10C, it may be connected to the second portion 2022, or may be connected to both the first portion 2021 and the second portion 2022. Further, the third region 203 may be connected to at least one of the third portion 2023B and the fourth portion 2024B in the multilayer substrate 10B illustrated in FIG. 4.

Figure 6:
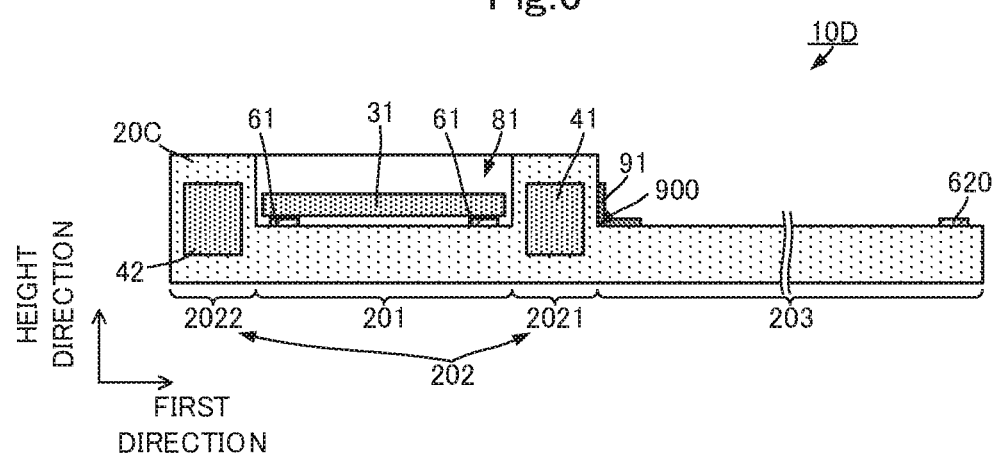
FIG. 6 is a cross-sectional view illustrating a structure of a multilayer substrate according to a fifth preferred embodiment of the present invention.

Next, a multilayer substrate according to a fifth preferred embodiment of the present invention will be described with reference the drawing. FIG. 6 is a cross-sectional view illustrating the multilayer substrate according to the fifth preferred embodiment of the present invention.

As illustrated in FIG. 6, a multilayer substrate 10D according to the fifth preferred embodiment is different from the multilayer substrate 10C of the fourth preferred embodiment in that an elastic member 91 is added. Other structures of the multilayer substrate 10D are the same as those of the multilayer substrate 10C of the fourth preferred embodiment, and descriptions of the same structures are skipped.

The multilayer substrate 10D includes an elastic member 91. The Young's modulus of the elastic member 91 is lower than the Young's modulus of flexible insulating base materials that constitute a substrate body 20C. The elastic member 91 covers a boundary portion 900 of a step defined by a first portion 2021 of a second region 202 and a third region 203.

In this structure, the third region 203 and the second region 202 are different in rigidity. For this reason, if the elastic member 91 is not provided, the boundary portion 900 is easily damaged by stress due to, for example, bending of the third region 203. In contrast, when the elastic member 91 is provided, damage of the boundary portion 900 due to this stress is significantly reduced or prevented.

Figure 7:
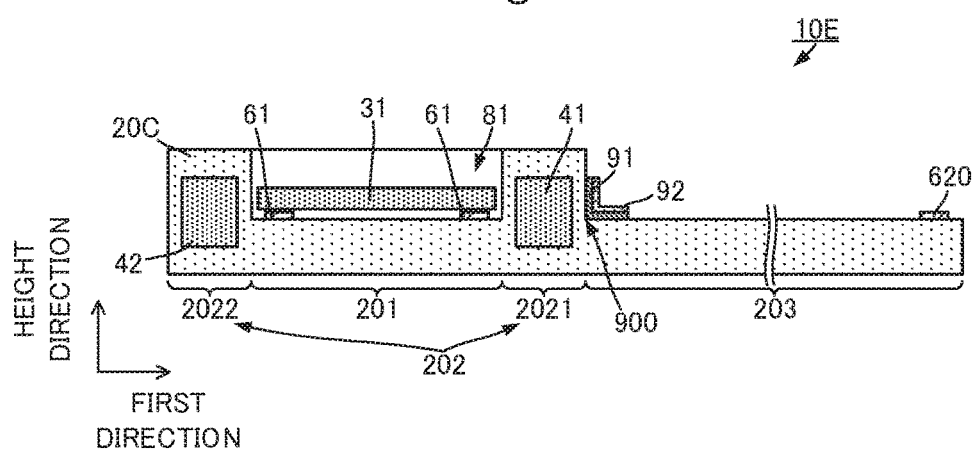
FIG. 7 is a cross-sectional view illustrating a structure of a multilayer substrate according to a sixth preferred embodiment of the present invention.

Next, a multilayer substrate according to a sixth preferred embodiment of the present invention will be described with reference to the drawing. FIG. 7 is a cross-sectional view illustrating a structure of the multilayer substrate according to the sixth preferred embodiment of the present invention.

As illustrated in FIG. 7, a multilayer substrate 10E according to the sixth preferred embodiment is different from the multilayer substrate 10D of the fifth preferred embodiment in that a protective member 92 is added. Other structures of the multilayer substrate 10E are the same as those of the multilayer substrate 10D of the fifth preferred embodiment, and descriptions of the same structures are skipped.

The multilayer substrate 10E includes a protective member 92. The protective member 92 is disposed on a surface of an elastic member 91 opposite from a substrate body 20C. The protective member 92 and the elastic member 91 are able to be realized by, for example, adhesive tape.

This structure more reliably reduces or prevents damage of a boundary portion 900 due to stress.

Next, a multilayer substrate and an electronic device according to a seventh preferred embodiment of the present invention will be described with reference to the drawing. FIG. 8 is a cross-sectional view illustrating a structure of an electronic device including a multilayer substrate according to the seventh preferred embodiment of the present invention.

As illustrated in FIG. 8, a multilayer substrate 10F according to the seventh preferred embodiment is different from the multilayer substrate 10C of the fourth preferred embodiment in the positions of external connection conductors 620. Other structures of the multilayer substrate 10F are similar to those of the multilayer substrate 10C, and descriptions of the similar structures are skipped.

External connection conductors 620 are disposed in an end portion of a third region 203 of the multilayer substrate 10F opposite from an end portion connected to a first portion 2021 and on a surface where the third region 203 is flush with a first region 201 and a second region 202.

The multilayer substrate 10F preferably is an electronic device 1 together with a circuit board 2. The multilayer substrate 10F is mounted on the circuit board 2. The circuit board 2 includes a front surface (one principal surface) 2H and a back surface (the other principal surface) 2R opposed to each other, and a predetermined circuit pattern is provided on the circuit board 2.

In this case, the first region 201 and the second region 202 of the multilayer substrate 10F are mounted on the front surface 2H of the circuit board 2. The third region 203 of the multilayer substrate 10F is curved along a side surface of the circuit board 2, and the end portion of the third region 203 opposite from the end portion connected to the first portion 2021 of the second region 202 is disposed on the back surface 2R of the circuit board 2. The external connection conductors 620 are bonded to land conductors 3 on the back surface 2R of the circuit board 2. That is, the external connection conductors 620 are electrically coupled to the circuit board 2 on the back surface 2R.

Since the third region 203 of the multilayer substrate 10F is thinner and shorter than the second region 202, it easily curves in the thickness direction. Therefore, as illustrated in FIG. 8, it is easy to mount the multilayer substrate 10F on the circuit board 2 in such a form as to be wound around the circuit board 2 from the front surface 2H of the circuit board 2 to the back surface 2R through the side surface side. That is, the multilayer substrate 10F is able to be mounted on the circuit board 2 with a high degree of freedom.

Since the second region 202 having a high rigidity is located between the third region 203 and the first region 201, even when the third region 203 greatly curves, stress applied to the first region 201 and the second region 202 by the curve is able to be significantly reduced or prevented. Therefore, it is possible to prevent, for example, damage of the first region 201 and the second region 202 and coming-off of the component.

In the above-described preferred embodiments, the recess 81 is rectangular or substantially rectangular in plan view. In the multilayer substrates of the preferred embodiments of the present invention, however, the shape of the recess 81 is not limited to the rectangular or substantially rectangular shape as long as the tall components are disposed in two portions of the second region between which the first region is located.

While the external connection conductors 620 are electrically coupled to the circuit board 2 on the back surface 2R of the circuit board 2 in the electronic device of the above-described preferred embodiment, alternatively, the external connection conductors 620 may be electrically coupled to the circuit board 2 on the front surface 2H while the third region 203 of the multilayer substrate 10F is bent or is not bent. Further, while the circuit board 2 and the multilayer substrate 10F are in contact with each other almost all over the front surface 2H in FIG. 8, they may be partly or entirely out of contact with each other, or the circuit board 2 and the multilayer substrate 10F may be out of contact with each other except for the portions connected to the external connection conductors 620.

The structures of the above-described preferred embodiments can be appropriately combined, and operational advantages can be obtained according to the combinations.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
   a substrate body defined by a laminate of a plurality of flexible insulating base materials; and
   a shorter component, a first taller component, and a second taller component disposed in the substrate body, the shorter component having a height less than that of the first and second taller components; wherein
   the substrate body includes a first region and a second region;
   the first region is surrounded by the second region in plan view and is shorter than the second region;
   the shorter component is mounted on a bottom surface of a recess defined by the first region and the second region; and
   the first taller component and the second taller component are embedded in the second region of the substrate body, and are disposed at positions to cross a position of a mounting surface for the shorter component in a height direction of the substrate body and on both sides of the first region when the substrate body is viewed in plan.

2. The multilayer substrate according to claim 1, further comprising a third taller component embedded in the second region and having a height greater than the shorter component.

3. The multilayer substrate according to claim 2, wherein the second region includes four side wall surfaces surrounding the recess, and the side wall surfaces define a first portion, a second portion, a third portion, and a fourth portion;
   the first region is provided between the first portion and the second portion and between the third portion and the fourth portion;
   the first taller component is disposed in the first portion; and
   the second taller component is disposed in the second portion.

4. The multilayer substrate according to claim 3, wherein the third taller component is disposed in at least one of the first portion and the second portion.

5. The multilayer substrate according to claim 3, wherein the third taller component is disposed in at least one of the third portion and the fourth portion.

6. The multilayer substrate according to claim 1, wherein a thickness of the shorter component is smaller than a thickness of a thinnest flexible insulating base material of the plurality of flexible insulating base materials.

7. The multilayer substrate according to claim 1, wherein the substrate body includes a third region shorter than the second region; and
   the third region is disposed on a side of the second region opposite from the first region.

8. The multilayer substrate according to claim 7, further comprising:

an elastic member having a Young's modulus lower than a Young's modulus of the substrate body; wherein the elastic member covers a boundary portion between the second region and the third region.

9. The multilayer substrate according to claim 8, further comprising a protective member on a surface of the elastic member opposite from the substrate body.

10. The multilayer substrate according to claim 7, wherein the third region is bent.

11. An electronic device comprising:
the multilayer substrate according to claim 7; and
a circuit board; wherein
an external connection conductor is provided in the third region, and is electrically coupled to the circuit board.

12. The electronic device according to claim 11, wherein
the first region and the second region are disposed on one principal surface of the circuit board; and
the external connection conductor is electrically coupled to the circuit board on the other principal surface of the circuit board.

13. An electronic device comprising:
the multilayer substrate according to claim 7; and
a circuit board; wherein
an external connection conductor is provided in the third region, and is electrically coupled to the circuit board.

14. The electronic device according to claim 13, wherein
the first region and the second region are disposed on one principal surface of the circuit board; and
the external connection conductor is electrically coupled to the circuit board on the other principal surface of the circuit board.

15. The multilayer substrate according to claim 1, wherein the shorter component is an IC chip, and the first and second taller components are at least one of a capacitor, an inductor and a resistor.

16. The multilayer substrate according to claim 1, wherein a thickness of the first taller component is equal to or substantially equal to that of the second taller component.

17. The multilayer substrate according to claim 1, wherein the substrate body includes a plurality of interlayer connection conductors connected to the first and second taller components.

18. The multilayer substrate according to claim 1, further comprising a mounting land connector on the substrate body and connected to the shorter component.

19. The multilayer substrate according to claim 1, further comprising a plurality of third taller components embedded in the second region and having a height greater than the shorter component.

* * * * *